(12) United States Patent
Kuo

(10) Patent No.: US 7,037,832 B1
(45) Date of Patent: May 2, 2006

(54) METHOD OF FORMING A CONDUCTIVE PATTERN BY REMOVING A COMPOUND WITH HEAT IN A SUBSTANTIALLY INERT ATMOSPHERE

(75) Inventor: Yue Kuo, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 10/753,214

(22) Filed: Jan. 5, 2004

Related U.S. Application Data

(63) Continuation-in-part of application No. 09/736,043, filed on Dec. 12, 2000, now abandoned.

(60) Provisional application No. 60/171,259, filed on Dec. 15, 1999.

(51) Int. Cl.
*H01L 21/44* (2006.01)

(52) U.S. Cl. ........................................ 438/669; 438/706

(58) Field of Classification Search ................ 438/706, 438/712, 610, 669
See application file for complete search history.

(56) References Cited

U.S. PATENT DOCUMENTS

| 5,281,447 A | * | 1/1994 | Brady et al. | 427/555 |
| 5,350,484 A | * | 9/1994 | Gardner et al. | 438/669 |
| 5,736,002 A | * | 4/1998 | Allen et al. | 438/705 |
| 6,010,603 A | * | 1/2000 | Ye et al. | 204/192.35 |
| 6,057,230 A | * | 5/2000 | Liu | 438/637 |
| 6,281,589 B1 | * | 8/2001 | Nguyen et al. | 257/774 |

OTHER PUBLICATIONS

"Control Using $Cl_2$ Gas as a Single Reactant," J. Vac. Sci. Technol. B, 15 (2), p. 237, 1997.
"National Technology Roadmap for Semiconductors (NTRS)," Semiconductor Industry Association (SIA), 1997.
H. Miyazaki, et al., "Copper Dry Etching with Precise Wafer-temperature Control Using $Cl_2$ Gas as a Single Reactant," J. Vac. Sci. Technol. B. 15 (2), p. 237, 1997.
J.W. Lee, et al., "Copper Dry Etching with $Cl_2$/Ar Plasma Chemistry," J. Electrochem. Soc., 145 (7), p. 2585, 1998.

(Continued)

*Primary Examiner*—W. David Coleman
(74) *Attorney, Agent, or Firm*—Baker Botts L.L.P.

(57) ABSTRACT

A method for forming a conductive or magnetic pattern for a semiconductor or other electronic device includes patterning a mask layer outwardly from a conductive layer of the semiconductor device. The patterning defines portions of the conductive layer where vias through the conductive layer are desired. The method also includes exposing the semiconductor device to a plasma. The plasma converts the unmasked portions of the conductive layer into a compound. The method further includes exposing the semiconductor device to a treatment process to selectively remove the compound. The mask layer may be removed either before or after removal of the compound, thereby providing the unmasked conductive layer in the desired pattern.

15 Claims, 2 Drawing Sheets

OTHER PUBLICATIONS

Y. Ohshita, et al., "Lower Temperature Plasma Etching of Cu Using IR Light Irradiation," Thin Solid Films, 262, p. 67, 1995.

G.C. Schwartz, et al., "Reactive Ion Etching of Copper Films," J. Electrochem. Soc., 130, p. 1777, 1983.

B.J. Howard, et al., "Reactive Ion Etching of Copper in SiCl4-based Plasmas," Appl. Phys. Lett., 59, p. 914, 1991.

M. Markert, et al., "Copper Dry Etching Technique for ULSI Interconnections," Microelectronic Engineering, 35, p. 333, 1997.

IBM Journal of Research and Development, special issue on Plasma Processing, Guest editor, Y. Kuo, 43(1/2), 1999.

Sangheon Lee, et al., "Process Study of a New Copper Dry Etching Method—The HCL Chemistry," Elecrochem. Soc. Plasma Processing XIII Proceedings, 2000.

Sangyu Lee, et al., "Amorphous Silicon Thin Film Transistor Fabricated with a New Copper Dry Etching Method," Procs. ECS TFTTV Symp., Phoenix AZ, pp. 34-39, 2001.

Sangheon Lee, et al., "A Reactive Ion Etching Based Copper Etch Process" Thin Film Microelectronics Lab., TAMU, presented on Nov. 2, 1999, Dallas, Texas, 1999.

Yue Kuo, et al., "A Reactive Ion Etching Based Copper Etch Process," AiChE's 1999 Annual Meeting, Reasearch & Development for Results, www.aiche.org, 1999.

Yue Kuo, et al., "Amorphous Silicon Thin-Film Transistors Fabricated with a New Copper Etching Method," Meeting Abstracts of the Electrochemical Society, Abstract No. 762, 2000.

Yue Luo, et al., "A Novel Plasma-Based Copper Dry Etching Method," Jpn. J. Appl. Phys., vol. 39, pp. L188-L190, Mar. 15, 2000.

Yue Luo, et al., "A New Copper Reactive Ion Etching Process," Meeting Abstracts, The 1999 Joint International Meeting, vol. 99-2, Abstract No. 704, Presented Oct. 20, 1999.

Yue Luo, et al., "Plasma Process of a New Copper Dry Etching Method," Meeting Abstracts, Toronto, The Electrochemical Society, vol. 2000-1, Abstract No. 296, 2000.

Yue Luo, et al., "A New Copper Dry Etching Process," The Electrochemical Society, Inc., Proceedings vol. 99-30, pp. 328-335.

Yue Luo, et al., "[190i]—A Reactive Ion Etching Based Copper Etch Process," American Institute of Chemical Engineers, www.aiche.org/conferences/techpro...aperdetail.asp?PaperID=3270&DSN=annual99, 1999.

Yue Kuo, et al., "A Novel Room-Temperature Plasma-Based Copper Etching Process for VLSI," Paper #2.D Presented in 2000 VLSI Multilevel Inteconnection Conference (VMIC), Santa Clara, California, Jun. 27, 2000.

Brian Chapman, "Glow Discharge Processes—Sputtering and Plasma Etching", p. 314, 1980.

Brian Chapman, "Glow Discharge Processes—Sputtering and Plasma Etching", p. 317, 1980.

U.S. Appl. No. 09/736,043, entitled *Semiconductor Conductive Pattern Formation Method*", inventor, Yue Kuo, Dec. 12, 2000.

* cited by examiner

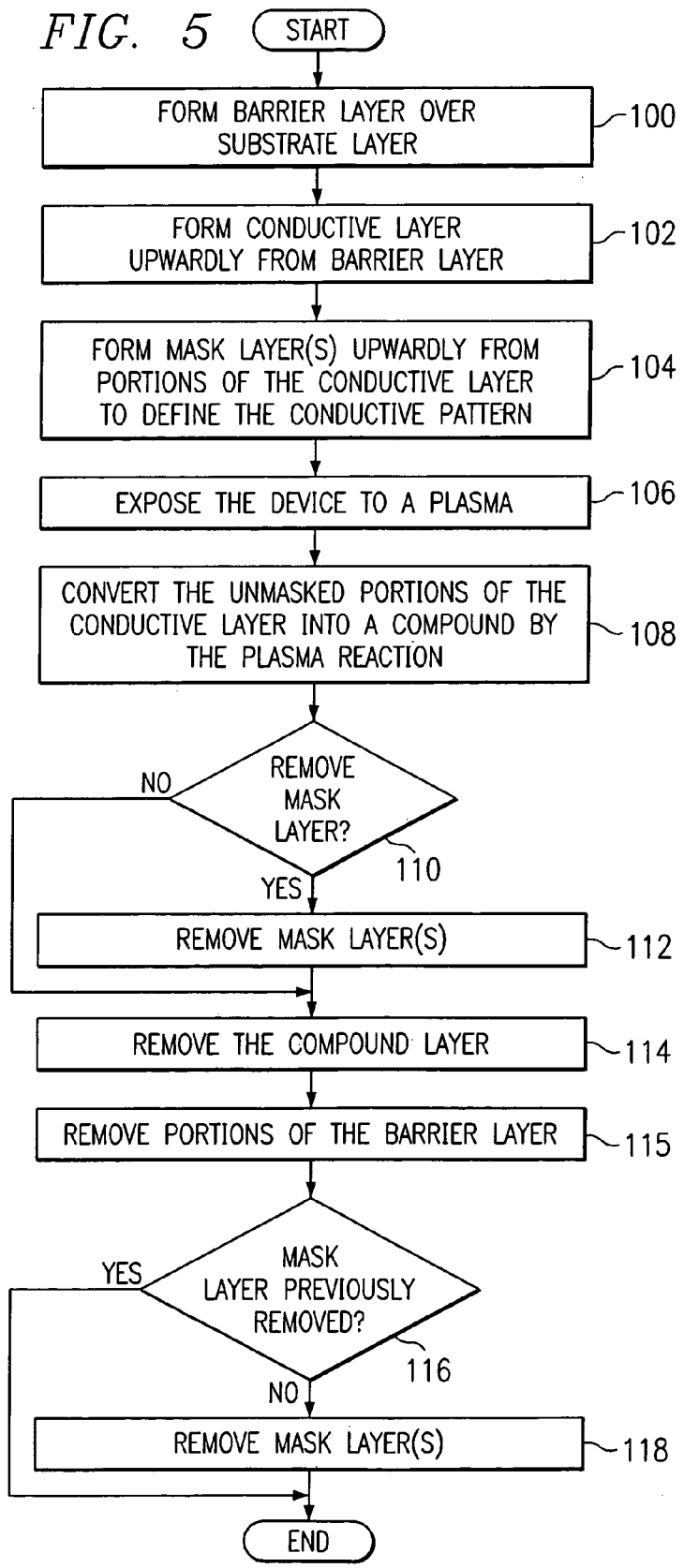

METHOD OF FORMING A CONDUCTIVE PATTERN BY REMOVING A COMPOUND WITH HEAT IN A SUBSTANTIALLY INERT ATMOSPHERE

CROSS-REFERENCE TO RELATED APPLICATIONS

This application is a continuation-in-part to U.S. application Ser. No. 09/736,043, filed Dec. 12, 2000 now abandoned, and entitled Semiconductor Conductive Pattern Formation Method, which claims priority under 35 U.S.C. § 119 of provisional application Ser. No. 60/171,259 filed on Dec. 15, 1999.

TECHNICAL FIELD OF THE INVENTION

This invention relates in general to the field of semiconductors, and more particularly to a method of forming a conductive pattern by removing a compound with heat in a substantially inert atmosphere.

BACKGROUND OF THE INVENTION

Ultra-large scale integrated circuits (ULSI), microelectronics, optoelectronics, and other electronic devices and products generally require fine interconnection or conductive patterns to accommodate functionality and density constraints. However, fine interconnection patterns are increasingly difficult to control. For example, one material used to form interconnection patterns is copper. Copper may be used for interconnection patterns rather than aluminum materials because copper generally has a higher conductivity, substantially no hillocks formation, and substantially no electron migration. Actually, copper interconnection may be required for the sub 180 nanometer ULSI. However, one problem associated with copper trace or line formation is that there is a lack of an effective dry etching process to prepare well-controlled copper fine lines. For example, copper lines are generally prepared with a chemical mechanical polishing (CMP) process, such as Damascene or dual-Damascene. However, when the minimum device geometry is reduced or shrunk to less than 100 nanometers, such a process is especially difficult for use in etching and filling high aspect ratio structures.

Plasma etching of copper has also been used to form interconnection patterns. For example, the most common etching chemistry is derived from an aluminum etch, i.e., using halogen-containing gases as the feed streams. Since the reaction products of the plasma etch, i.e., copper halides, have very low volatilities at room temperature, the reaction products often accumulate on the surface of the product or device instead of being removed. In order to facilitate the removal of these halides, a high-energy source, such as a high-density plasma, a laser, an infrared (IR) or ultraviolet (UV) beam, or a high substrate temperature, needs to be added to a reactive ion etching (RIE) chamber. Such methods either may have poor etch uniformity for large area substrates or require a complicated reactor design and process control scheme. The high temperature approach does not have the above described problems, but still requires high ion bombardment energy to achieve a high etch rate. Additionally, the selectivity of copper or other interconnection materials to another film will generally be lowered by the high ion bombardment energy. In many of the copper etching processes, for example, the etch rate is negative, i.e., the etched surface is higher than the unetched surface due to the accumulation of the reaction product.

SUMMARY OF THE INVENTION

Accordingly, a need has arisen for an improved interconnection or pattern forming method for microelectronic, optoelectronic and other electronic devices. The present invention provides a method for conductive or magnetic pattern formation that addresses disadvantages and problems associated with previous conductive pattern formation methods.

In accordance with one embodiment of the present invention, a method for forming a magnetic or conductive pattern for a semiconductor device includes patterning a mask layer outwardly from a conductive layer of the semiconductor device. The patterning defines portions of the conductive layer where vias or open areas through the conductive layer are desired. The method also includes exposing the semiconductor device to a plasma. The plasma converts the unmasked portions of the conductive layer into a compound. The method further includes exposing the semiconductor device to a treatment process to selectively remove the compound.

According to another embodiment of the present invention, a method for forming a pattern for an electronic device includes forming a conductive layer outwardly from a substrate of the electronic device and patterning a mask layer outwardly from the conductive layer. The patterning defines portions of the conductive layer where vias or open areas through the conductive layer are desired. The method also includes exposing the electronic device to a plasma. The plasma converts the unmasked portions of the conductive layer into a compound. The method further includes exposing the semiconductor device to a treatment process to selectively remove the compound. The method also includes removing the mask layer from the masked portions of the conductive layer.

The present invention provides several technical advantages. For example, the present invention provides magnetic or conductive pattern formation using a generally high etch rate. Another advantage of the present invention is that the prevention may be applied to a large-area substrate. A further advantage of the present invention is that the method is compatible with other semiconductor processes and device requirements.

Other aspects and technical advantages will be readily apparent to one skilled in the art from the following figures, descriptions and claims.

BRIEF DESCRIPTION OF THE DRAWINGS

For a more complete understanding of the present invention and the advantages thereof, reference is now made to the following description taken in conjunction with the accompanying drawings, in which:

FIG. 5 is a flow diagram illustrating conductive pattern formation in accordance with an embodiment of the present invention.

DETAILED DESCRIPTION OF THE INVENTION

FIGS. 1–4 illustrate the formation of an electronic device 10 in accordance with an embodiment of the present invention. Device 10 may include a semiconductor device, microelectronic device, optoelectronic device, magnetic device, or any other device requiring a conductive interconnection pattern.

Figure 1:
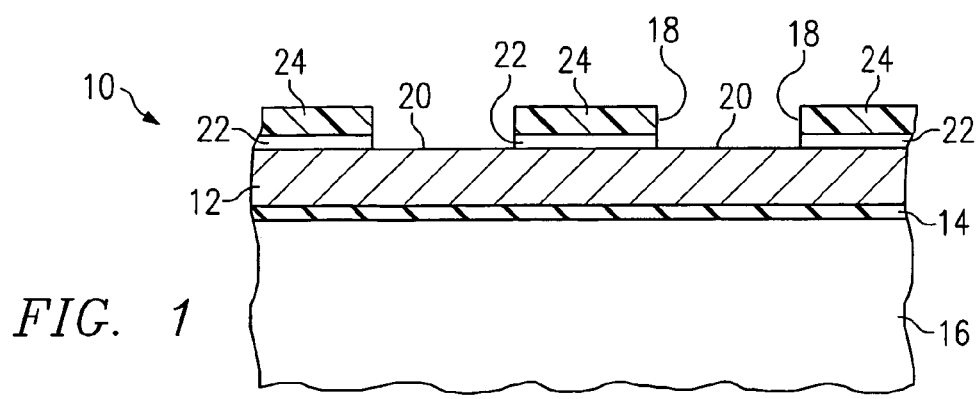
FIG. 1 illustrates a schematic cross-sectional diagram of a semiconductor device having a mask layer formed over a conductive layer that is deposited on a substrate in accordance with an embodiment of the present invention.

Referring to FIG. 1, a conductive layer 12 and a barrier layer 14 are formed upwardly from a substrate 16. Substrate 16 may include glass, silicon, plastic, metal, or any other suitable substrate material. Barrier layer 14 may include titanium, titanium oxide, titanium nitride, tantalum, tantalum oxide, tantalum nitride, chromium, or any other suitable material to enhance the adhesion of the conductive layer 12 and/or to substantially prevent diffusion of the material comprising the conductive layer 12 into the substrate 16. Thus, layer 14 may comprise either conductive or non-conductive materials corresponding to a particular application. However, it should be understood that conductive layer 12 may also be formed upwardly from substrate 16 without barrier layer 14.

Conductive layer 12 may include copper, nickel, and iron, alloys or compounds of copper, nickel and iron, or other suitable conductive or magnetic materials for providing conductive interconnections or magnetic patterns on the device 10. As illustrated in FIG. 1, one or more mask layers 18 are formed upwardly from conductive layer 12 to define open areas or vias 20 through the conductive layer 12 at desired locations. For example, one or more of the mask layers 18 are formed over the conductive layer 12 to define a desired conductive or magnetic pattern for the device 10, thereby masking a portion of the conductive layer 12 that will remain on the device 10. Unmasked portions of the conductive layer 12 corresponding to the vias 20 are removed, as will be discussed in greater detail below, thereby forming open areas or vias 20 through the conductive layer 12.

In the embodiment illustrated in FIG. 1, mask layers 18 include a hard masking layer 22 formed upwardly from the conductive layer 12, and a photoresist layer 24 formed upwardly from the masking layer 22. The function of layer 22 is to provide a protection, a passivation, or a diffusion barrier to the conductive layer 12. Masking layer 22 may include silicon oxide, silicon nitride, metals, metal oxides, or other suitable materials to provide additional etching layers of device 10 to accommodate a variety of pattern formations and/or etching techniques. However, it should be understood that photoresist layer 24 may be formed upwardly from the conductive layer 12 without the masking layer 22.

Figure 2:
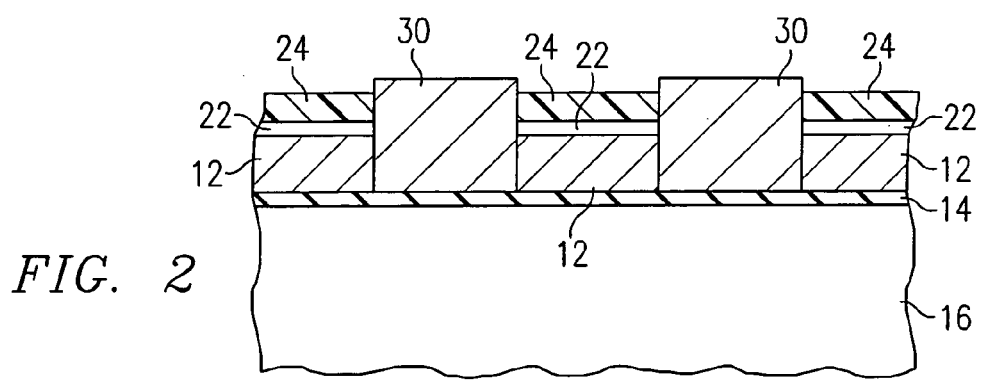
FIG. 2 illustrates a schematic cross-sectional diagram of the semiconductor device of FIG. 1 after plasma exposure in accordance with an embodiment of the present invention.

Referring to FIG. 2, device 10 is then exposed to a plasma in a plasma reactor (not explicitly shown). The plasma reactor may have a conventional simple parallel-plate design or have a high density plasma (such as inductive-coupled plasma ICP, electron cyclotron resonance ECR, hellicon plasma, or other suitable designs). The plasma exposure may be performed using conventional plasma etching or deposition techniques, such as, but not limited to, 1 mTorr to 10 Torr pressure. An electrode, located generally where device 10 is loaded into the reactor, may be heated with an electric heater, a hot oil coil, an infrared source, or other suitable methods. A wide range of substrate 10 temperatures may be used during the plasma exposure, such as, but not limited to, from lower than room temperature to approximately 500 degrees Celsius.

In one embodiment, the plasma may be generated outside the reactor and subsequently introduced into the chamber; however, the plasma may be generated within the reactor. The substrate may be electrically biased with a DC or RF power source, or the substrate may be heated, to enhance conversion of unmasked portions of the conductive layer 12 in a compound layer.

The plasma includes one of a variety of gases comprising an element selected from the halogen group of elements, such as, but not limited to, chlorine, bromine, fluorine, iodine, or their mixtures, as the reactive component in the feed stream of the plasma exposure process. For example, the plasma may include a chlorine-containing gas such as HCl, $Cl_2$, organic or inorganic chloride, HBr, $Br_2$, HI, $I_2$ or their mixtures. Other gases, such as, but not limited to, oxygen, inert gases, and nitrogen may be mixed with the reactive component to enhance the plasma-conductive layer 12 reaction.

Referring to FIG. 2, a cross-sectional view of device 10 is illustrated after the plasma exposure. As illustrated in FIG. 2, unmasked portions of the conductive layer 12 are converted into a compound layer 30 as a result of the chemical reaction between the plasma and the exposed portions of the conductive layer 12. For example, if the conductive layer 12 comprises copper and the plasma comprises an HCl plasma, a copper chloride layer may be formed as compound layer 30.

Depending on the reaction mechanism and process characteristics, the compound layer 30 may be thicker than the original conductive layer 12. For example, the compound layer 30 may grow isotropically when it is higher than the mask layers 18. Additionally, the plasma exposure process may also be controlled to form an interface between the masked portion of the conductive layer 12 and the compound layer 30 that is substantially perpendicular to the surface of the substrate 16. The plasma exposure process may also be controlled to form a sloped or angled interface at a variety of angular orientations between the masked portion of the layer 12 and the compound layer 30. Such plasma exposure characteristics as the gas type, pressure, power, time, and the substrate temperature may be varied to form a desired interface between the masked portion of the conductive layer 12 and the compound layer 30.

Figure 3:
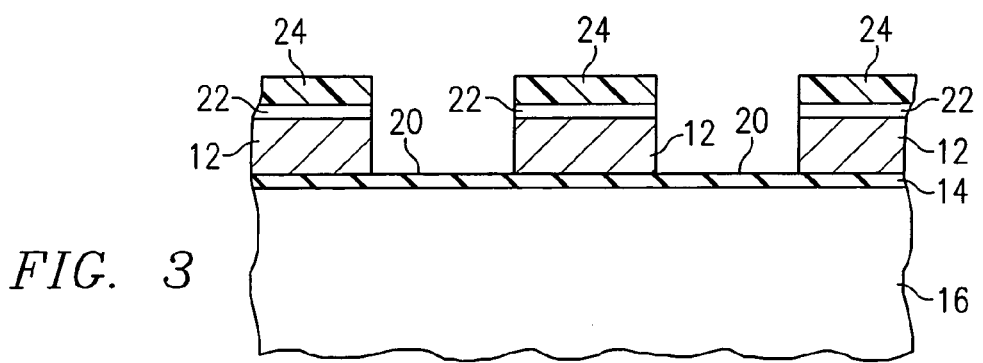
FIG. 3 illustrates a schematic cross-sectional diagram of the semiconductor device of FIGS. 1 and 2 after plasma-converted compound layer material removal in accordance with an embodiment of the present invention.

Referring to FIG. 3, the device 10 is illustrated after removal of the compound layer 30. The device 10 may be exposed to a physical or chemical environment or process to remove the compound layer 30. For example, if the compound layer 30 comprises copper chloride resulting from the reaction of a copper material conductive layer 12 with a HCl plasma as described above, a hydrogen chloride (HCl) solution may be used to remove the compound layer 30 with substantially little affect to the remaining conductive layer 12 and/or mask layers 18. In another method, using copper chloride as the compound layer 30 for example, the copper chloride may be removed by heating the device 10 to a high temperature, such as between 500–600 degrees Celsius, under vacuum or in an inert atmosphere because the copper chloride material has generally a much lower higher vapor pressure than copper material. Another alternative method includes exposing the device 10 to an energized electron or ion beam that will evaporate the compound layer 30. A laser, IR, or UV beam could also be used to remove the compound layer 30. However, other suitable methods or techniques may also be used to remove the compound layer 30.

Figure 4:
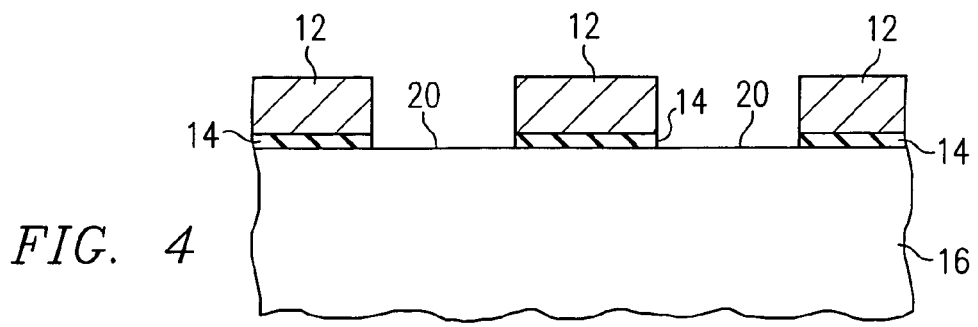
FIG. 4 illustrates a schematic cross-sectional diagram of the semiconductor device of FIGS. 1–3 after the mask layer and the compound removal in accordance with an embodiment of the present invention.

Referring to FIG. 4, the device 10 is illustrated after removal of portions of layer 14 corresponding to the vias 20 and the mask layers 18, thereby providing the desired conductive or magnetic pattern. Layer 14 may be selectively removed from the via 20 locations using conventional methods, including, but not limited to, etching processes. However, it should be understood that layer 14 may remain on the device 10, for example, if layer 14 comprises an insulating material. The mask layers 18 may be removed using conventional methods such as, but not limited to, a plasma process, a solvent dipping, or a combination of plasma processes and solvent dipping. For example, the photoresist layer 24 may be removed using an acetone solution in an ultrasonic bath at approximately sixty degrees Celsius. However, other suitable methods may also be used to remove the mask layers 18. Additionally, the mask layers 18 may be removed either before or after the removal of the compound layer 30, and layer 14 may be removed either after or before removal of the mask layers 18.

FIG. 5 is a flow diagram illustrating a method for conductive pattern formation on a device 10 in accordance with an embodiment of the present invention. The method begins at step 100, where the barrier layer 14 is formed upwardly from the substrate 16. However, it should be understood that the barrier layer 14 may be omitted to accommodate a particular device 10 configuration or materials selection. At step 102, conductive layer 12 is formed upwardly from barrier layer 14, or upwardly from the substrate 16 if the barrier layer 14 was omitted. As described above, the conductive layer 12 may include copper, nickel, iron, or other suitable conductive or magnetic materials.

At step 104, one or more mask layers 18 are formed upwardly over portions of the conductive layer 12 to define a desired conductive pattern. For example, a mask layer 18 is configured to a desired conductive pattern for the device 10, thereby creating vias 20 corresponding to unmasked portions of the conductive layer 12 that will be removed to form the desired conductive pattern. At step 106, the device is exposed to a plasma in a plasma reactor. The plasma may be generated outside the reactor or within the reactor. As described above, the plasma comprises a gas selected from the halogen group of elements such as, but not limited to, chlorine, bromine, fluorine, and iodine. At step 108, exposure of the device 10 to the plasma converts the unmasked portions of the conductive layer 12 to a compound layer 30.

At decisional step 110, a determination is made whether to remove the mask layers 18 before or after removal of the compound layer 30. If removal of the mask layers 18 is desired before removing the compound layer 30, the method proceeds to step 112, where mask layers 18 are removed using conventional methods. If removal of the mask layers 18 is desired after removal of the compound layer 30, the method proceeds from step 110 to step 114.

At step 114, the compound layer 30 is removed from the device 10, thereby forming the open areas or vias 20 in the conductive layer 12 corresponding to the previously unmasked portions of the conductive layer 12. At step 115, layer 14 may be removed from the substrate 16 corresponding to the via 20 locations. As described above, layer 14 may be removed either after or before removal of the mask layers 18. At decisional step 116, a determination is made whether the mask layers 18 were previously removed. If the mask layers 18 were not removed before removal of the compound layer 30, the method proceeds from step 116 to step 118, where the mask layers 18 are removed. If the mask layers 18 were removed prior to removal of the compound layer 30, the method terminates.

Thus, the present invention provides a conductive or magnetic pattern formation method that provides greater control and creation of fine conductive interconnection lines or traces for semiconductors and other electronic devices than prior pattern formation processes. Additionally, the pattern formation method of the present invention may be used with conventional semiconductor fabrication equipment and facilities, thereby substantially reducing or eliminating costly facility upgrades, retrofits, or the design and manufacturing of unconventional new tools to form fine line conductive or magnetic patterns.

Although the present invention and its advantages have been described in detail, it should be understood that various changes, substitutions, and alterations can be made therein without departing from the spirit and scope of the present invention as defined by the appended claims.

What is claimed is:

1. A method for forming a conductive pattern for a semiconductor device, comprising:
    patterning a mask layer outwardly from a conductive layer of the semiconductor device, the patterning defining portions of the conductive layer where vias through the conductive layer are desired;
    exposing the semiconductor device to a plasma using a plasma deposition reactor, the plasma converting the unmasked portions of the conductive layer into a compound;
    exposing the semiconductor device to a treatment process, the treatment process selectively removing the compound; and
    wherein exposing the semiconductor device to a treatment process comprises:
    exposing the semiconductor device to a substantially inert atmosphere; and
    heating the semiconductor device to between 300 and 800 degrees Celsius while the semiconductor device is exposed to the substantially inert atmosphere to remove the compound.

2. The method of claim 1, wherein exposing the semiconductor device to a plasma deposition reactor comprises wherein exposing the semiconductor device to a plasma generated outside the plasma deposition reactor.

3. The method of claim 1, and further comprising enhancing the conversion of the unmasked portions of the conductive layer into a compound by biasing the semiconductor device with a power supply while exposing the semiconductor device to a plasma.

4. The method of claim 1, wherein the conductive layer comprises a copper material.

5. The method of claim 1, further comprising providing a barrier layer between the conductive material and a substrate of the semiconductor device.

6. The method of claim 1, wherein the conductive material comprises a copper material, and wherein exposing the semiconductor device to a plasma comprises exposing the semiconductor device to a chlorine-containing gas.

7. The method of claim 6, wherein the compound comprises a copper chloride material, and wherein exposing the semiconductor device to a treatment process comprises exposing the semiconductor device to a hydrogen chloride solution to remove the copper chloride material.

8. The method of claim 1, wherein the mask layer comprises a photoresist material.

9. A method for forming a conductive pattern for an electronic device, comprising:
   forming a conductive layer outwardly from a substrate of the electronic device;
   patterning a mask layer outwardly from the conductive layer, the patterning defining portions of the conductive layer where vias through the conductive layer are desired;
   exposing the electronic device to a plasma using a plasma deposition reactor and at least one other gas selected from the group of inert gases and nitrogen, the plasma converting the unmasked portions of the conductive layer into a compound and the at least one other gas enhancing the conversion into the compound;
   in a separate process from forming the compound, exposing the electronic device to a treatment process to selectively remove the compound;
   removing the mask layer from the masked portions of the conductive layer; and
      wherein exposing the electronic device to a treatment process comprises:
      exposing the electronic device to a substantially inert atmosphere; and
      heating the electronic device to between 300 and 800 degrees Celsius while the electronic device is exposed to the substantially inert atmosphere to remove the compound.

10. The method of claim 9 wherein removing the mask layer comprises removing the mask layer before removing the compound.

11. The method of claim 9, wherein forming a conductive layer comprises forming a copper layer outwardly from the substrate.

12. The method of claim 9, wherein the plasma comprises a gas having an element selected from the halogen group of elements.

13. The method of claim 9, further comprising providing a barrier layer between the conductive layer and the substrate of the electronic device.

14. The method of claim 9, wherein exposing the electronic device to a plasma comprises controlling the exposure of the electronic device to the plasma to form a substantially perpendicular interface between the masked conductive material and the compound.

15. The method of claim 9, wherein patterning a mask layer comprises patterning a photoresist layer outwardly from the conductive layer.

* * * * *